United States Patent
Gonzalez

[19]

[11] Patent Number: 6,133,123
[45] Date of Patent: Oct. 17, 2000

[54] FABRICATION OF SEMICONDUCTOR GETTERING STRUCTURES BY ION IMPLANTATION

[75] Inventor: Fernando Gonzalez, Boise, Id.

[73] Assignee: Micron Technology, Inc., Boise, Id.

[21] Appl. No.: 08/916,940

[22] Filed: Aug. 21, 1997

[51] Int. Cl.[7] .................................................. H01L 21/425
[52] U.S. Cl. ......................... 438/525; 438/402; 438/424; 148/DIG. 60
[58] Field of Search ..................................... 438/528, 524, 438/526, 402, 424, 440, 433, 525, FOR 145; 148/DIG. 60

[56] References Cited

U.S. PATENT DOCUMENTS

| | | | |
|---|---|---|---|
| 5,316,965 | 5/1994 | Philipossian et al. . | |
| 5,441,899 | 8/1995 | Nakai et al. | 437/24 |
| 5,445,975 | 8/1995 | Gardner et al. | 437/10 |
| 5,571,744 | 11/1996 | Demirlioglu et al. | 437/57 |
| 5,616,513 | 4/1997 | Shepard | 438/402 |
| 5,770,504 | 6/1998 | Brown et al. . | |
| 5,899,732 | 5/1999 | Gardner et al. . | |

OTHER PUBLICATIONS

S.M. SZE, VLSI Technology, Isolation, pp. 476–477, 1988.

*Primary Examiner*—Charles Bowers
*Assistant Examiner*—Scott J. Hawranek
*Attorney, Agent, or Firm*—Workman, Nydegger & Seeley

[57] ABSTRACT

The present invention relates to the formation of multiple gettering structures within a semiconductive substrate by ion implantation through recesses in the semiconductive substrate. A preferred embodiment of the present invention includes forming the recesses by using a reactive anisotropic etching medium, followed by implanting a gettering material. The gettering material is implanted by changing the gettering material for the reactive anisotropic etching medium. An advantage of the method of the present invention is that gettering structures are formed without the cost of an extra masking procedure and without the expense of MeV implantation equipment and procedures. As a result, metallic contaminants will not move as freely through the semiconductive substrate in the region of an active area proximal to the gettering structures. Following implantation and formation of the gettering structures, thermal processing may be carried out in order to induce lateral spread or widening of each of the gettering structures. In some embodiments it may be desirable that each gettering structure substantially contact an adjacent gettering structure, which may be accomplished by directional ion implantation. In another embodiment of the present invention, a dual implantation is carried out. The shallow implantation migrates during thermal processing to fill crystal originated particles or pits (COPs) within the semiconductive substrate.

35 Claims, 4 Drawing Sheets

FABRICATION OF SEMICONDUCTOR GETTERING STRUCTURES BY ION IMPLANTATION

BACKGROUND OF THE INVENTION

1. The Field of the Invention

The present invention relates to semiconductor devices. More particularly, the present invention relates to semiconductor gettering structures and methods of forming them. One embodiment of the present invention relates to ion-implanted gettering structures that are implanted substantially below the bottom of isolation trenches.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

The ever-present pressure upon the microelectronics industry to shrink electronic devices and to crowd a higher number of electronic devices onto a single die, called miniaturization, has required development of isolation trenches to replace such structures as local oxidation of silicon (LOCOS) regions. As miniaturization continues to shrink dimensions of electronic devices, limitations on the ability to restrict chemical impurities in the fabrication process are being reached. To compensate for such chemical impurities limitations, gettering structures are formed within semiconductive devices that have an affinity for chemical impurities.

One prior art method of forming a gettering structure is blanket implantation of ions within the semiconductive substrate as illustrated in FIG. 1 so as to damage the material of the semiconductive substrate. In FIG. 1 it can be seen that a semiconductor structure 10 includes a substrate 12, preferably composed of a semiconductor material, such as silicon or germanium, and having an upper surface 26 and an oxide layer 14 thereupon. Blanket implantation of semiconductor structure 10 is illustrated wherein a gettering structure 32 comprises damaged silicon created by ions that have been implanted with mega electron volt (MeV) implantation equipment. As referred to herein, KeV implantation equipment can implant with energy in a range from about 25 Kev to about 600 Kev, and MeV implantation equipment can implant with energy in a range from about 25 Kev to about 2800 Kev. Damage is contained within gettering structure 32 which is at a depth d seen in FIG. 1. Blanket implantation, however, causes damage in the semiconductive materials within gettering structure 32. A diode junction 42 at the bottom of active area 20 is seen below region 40 which adjacent to active area 20 and field oxide region 15 which can be formed by LOCOS processing.

Gettering structure 32 includes substantial disturbance of the monocrystalline lattice of the semiconductive material that not only compromises the semiconductive integrity of semiconductor substrate 12, but also allows contaminants to migrate and be captured within gettering structure 32. Attempts to improve the gettering efficiency of gettering structure 32, such as heat treating, may be constrained by the allowable thermal budget in a given process.

Lattice vacancies and crystal originated pits (COPs) often form during the crystal pulling process. COPs disturb the integrity of a semiconductor device due to surface pits. Self implantation of interstitials into region 30 seen in FIGS. 1 and 2, such as with silicon, can reduce the size of the surface pits or eliminate them with an anneal adequate thermal cycle.

Another way to form gettering structure 32 is to use a mask 18, as seen in FIG. 2, to keep the gettering implanted materials away from regions that will cause leakage or other problems, for example at an N-well edge. Mask 18, however, adds cost to the process. FIG. 2 illustrates the prior art method of implantation of a gettering structure 32 through a mask 18. It can been seen that a semiconductor structure 10 includes a substrate 12 composed of a semiconductor material such as silicon or germanium, an oxide layer 14, and mask 18. It can been seen that mask 18 has been patterned to form an implant corridor 22 through which ions may be implanted into substrate 12. Also shown is a bottom 42 of active area 20 below mask 18. A detriment of the structure see in FIG. 2 is the capital and energy requirements in masking the structure prior to implanting gettering structure 32.

Another problem of forming a gettering layer is the energy and equipment cost of using KeV implantation equipment versus MeV implantation equipment. KeV implantation equipment, which implants close to the surface of implantation, incurs a greater risk of defects close to the surface of implantation. Conversely, MeV implantation equipment can implant farther away from the surface of implantation than KeV implantation equipment and therefor has less of a risk of defects close to the surface of implantation. The cost of KeV implantation equipment is less than that of MeV implantation equipment.

Gettering structure 32 has a shape that has an initial width equivalent to the width of an implant corridor 22 and a final width W that is formed naturally by spreading implanted species. Region 30 may cause contaminants to be more mobile through the damaged lattice therein. Gettering structure 32 is required to be formed at a depth d, seen in FIG. 1, that is sufficiently beneath active area 20 such that metallic contaminants do not encroach therewithin.

What is needed is a method of forming a semiconductor gettering structure that avoids the problems of the prior art. In particular, what is needed is a method of forming a semiconductor gettering structure by ion implantation that minimizes crystal lattice dislocations caused by ion implantation. What is also needed is a method of forming a semiconductor gettering structure that uses less capital and energy cost than that which was used in the prior art.

SUMMARY OF THE INVENTION

The present invention relates to the formation of a gettering structure by ion implantation. Formation of a gettering structure is carried out by ion implantation of a material that has an affinity for impurities such as metals. Iron is a typical metal impurity. The ion implantation material may be such elements as oxygen, silicon, germanium, and equivalents. Ion implantation is carried out using high current implantation techniques that are known in the art.

A preferred embodiment of the present invention includes forming a recess in a semiconductive substrate within active areas that border on the recess. The recess is preferably formed by using a reactive anisotropic etching medium. Next, ions are implanted by changing the ion implantation process for a process for a reactive anisotropic etching medium. The inventive method creates separate gettering regions beneath the recess without causing substantial damage within active areas that border on the recess.

An advantage of the method of the present invention is that semiconductor gettering structures are formed without a masking procedure. Additionally, the inventive method can use KeV implantation equipment and processes, although more expensive MeV implantation equipment can also be used. Metallic contaminants will diffuse freely through the semiconductive substrate to any depth. Another advantage of the present invention is that lateral spread of ions that cause damage in the semiconductor substrate during implantation is reduced due to the lower energy KeV implantation of high current implantation as opposed to MeV implantation. Also, the lateral spread of ions during implantation is reduced due to a shallower implantation depth when using the lower energy KeV implantation of high current implantations.

Following implantation and formation of a gettering structure, thermal processing may be carried out in order to induce a lateral spreading or widening of the gettering structure. In some embodiments, it may be desirable that the gettering structure substantially contacts an adjacent gettering structure. Such substantial contact of gettering structures may be accomplished by a variable angle of ion implantation. As such, the method of forming a semiconductor structure includes expanding of the gettering structure by thermal processing.

In another embodiment of the present invention, a dual implantation is carried out. A semiconductor structure is dual implanted whereby a gettering structure and a shallow implantation are formed. The gettering structure has a higher concentration than the shallow implantation. Following dual implantation, a single anneal is carried out to eliminate vacancy clusters and silicon pits that are formed during routine crystal pulling at the region near an upper surface of the semiconductive substrate by injecting interstitials through a self-implantation. Subsequent annealing leaves the gettering structure substantially intact to act as a getterer for further processing and during field use.

The shallow implantation of the interstitial injection migrates during thermal processing to fill crystal originated particles or pits (COPs) within the semiconductive substrate. Where the semiconductive substrate is monocrystalline silicon, implantation of a neutral species such as silicon, germanium, and the like will add interstitials to the semiconductive substrate. During thermal processing, the interstitials will move into the COPs thereby rectifying defects caused during crystal pulling.

An alternate method embodiment combines implantation through a recess in the semiconductive substrate to form a gettering structure with forming a shallow implantation after filling the recess with a dielectric material. In this embodiment, thermal processing to expand the gettering structure is preferably controlled such that the gettering structure does not expand into a diode junction region and thereby cause leakage.

The present invention may be embodied in other specific forms without departing from its spirit or essential characteristics. The described embodiments are to be considered in all respects only as illustrated and not restrictive. These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of embodiments of the present invention and are not drawn to scale.

Figure 3A:
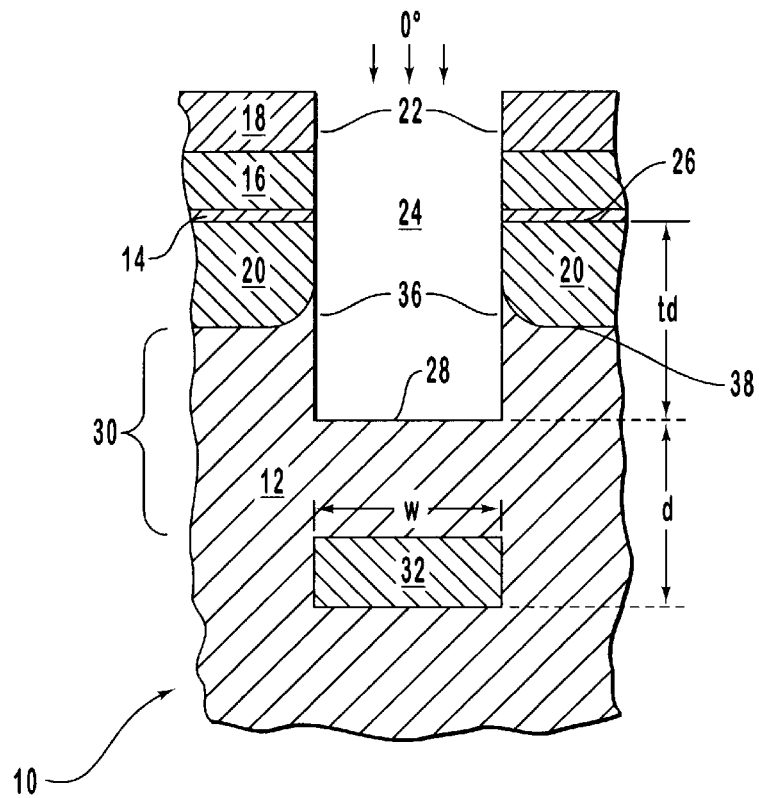
FIG. 3a is an elevational cross section view of an implanted semiconductor gettering structure located below the bottom of a recess, such as an isolation trench, and showing a gettering structure.
Figure 3B:
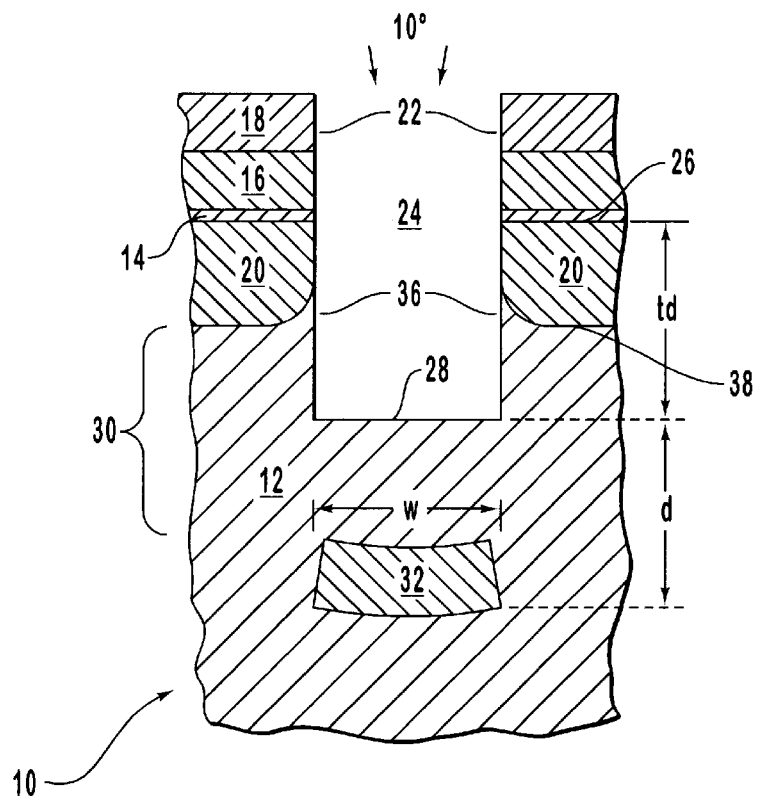
FIG. 3b is an elevational cross section view of the structure see in FIG. 3a, although the gettering structure is wider and has a different shape due to an alternative angles of ion implantation.

The present invention relates to the formation of a gettering structure by ion implantation. According to the present invention, FIGS. 3a and 3b illustrate a semiconductor structure 10 that includes a semiconductor substrate 12, oxide layer 14, nitride layer 16, and mask 18. Mask 18 is formed by patterning and etching, where the etching is preferably anisotropic etching. The etch forms a recess such as a trench 24. Trench 24 is interposed between two active areas 20. In this embodiment trench 24 is an isolation structure.

Formation of gettering structure 32 is carried out by ion implantation of a material that has an affinity for impurities such as metals. Iron is a typical metal impurity. The ion implantation material may be such materials as oxygen, silicon, germanium, and equivalents. Ion implantation is carried out using high current implantation techniques that are known in the art as having a KeV implantation power.

Where trench 24 is an isolation trench to isolate active areas 20, a depth $t_d$ of trench 24 is to be in a range from 0.1 microns to about 1.0 microns, preferably from about 0.2 microns to about 0.6 microns, and most preferably from about 0.2 microns to about 0.3 microns. Depth $t_d$+d of implantation of ions is measured from an upper surface 26 of substrate 12.

In general, a recess proposed by the inventive method that has a width in a range from about 0.2 microns to about 0.6 microns will preferably have a depth in a range from about 0.1 microns to about 1.0 microns. A recess proposed by the inventive method that has a width in a range from about 0.18 microns to about 0.25 microns will preferably have a depth in a range from about 0.2 microns to about 0.3 microns.

Figure 1:
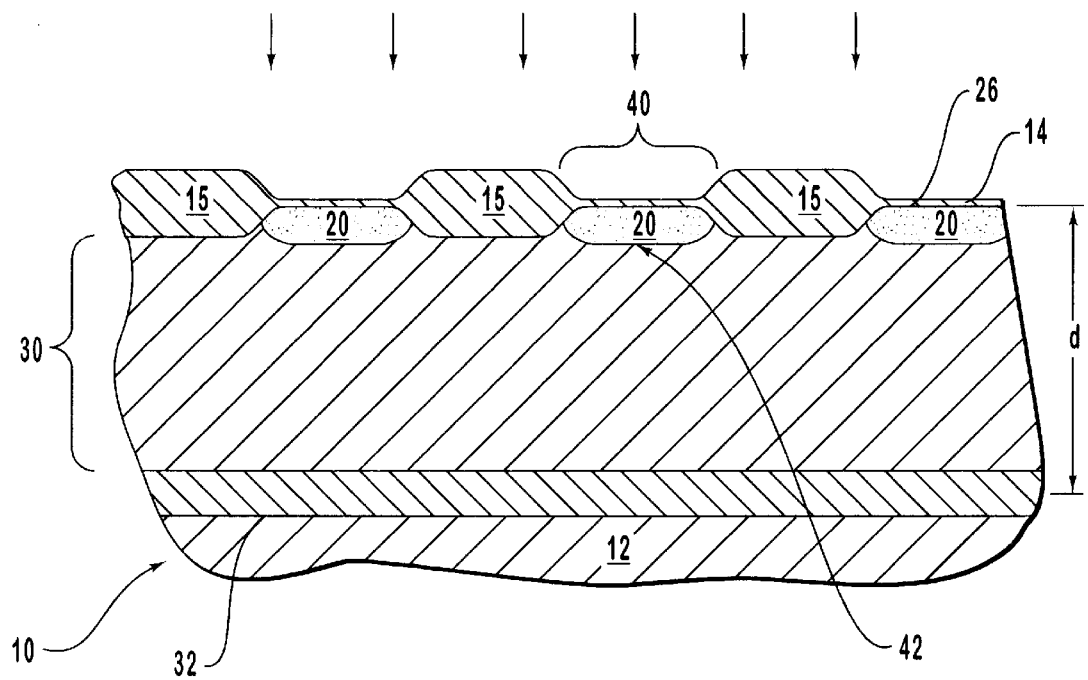
FIG. 1 is an elevational cross section view of a blanket implantation of a gettering layer according to the prior art.
Figure 2:
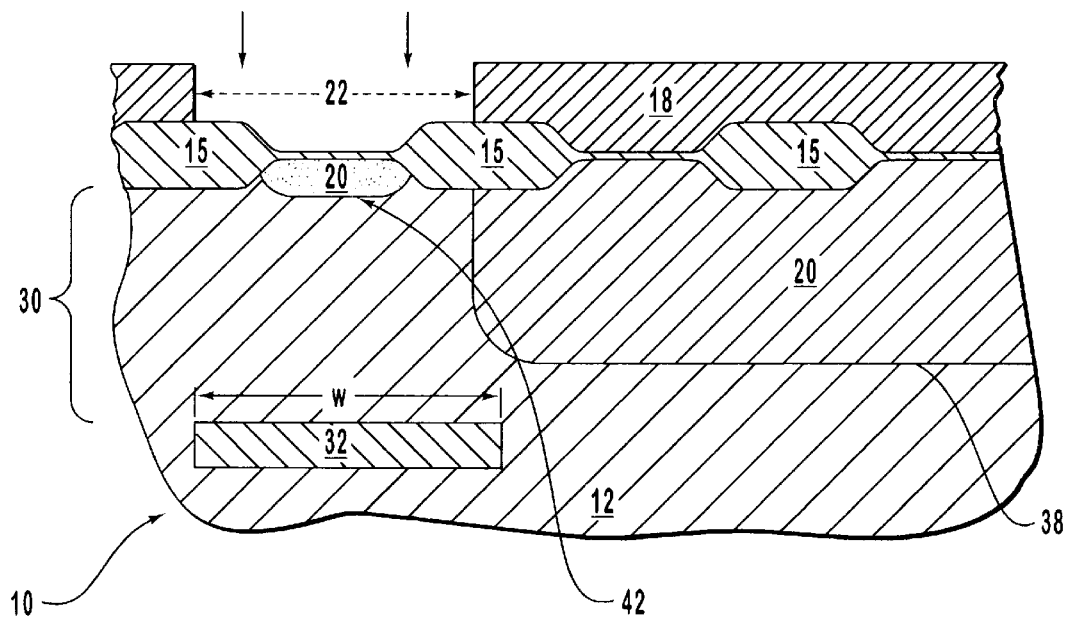
FIG. 2 is an elevational cross section view of an implantation of a gettering layer through a masking layer according to the prior art.

Implantation of ions according to the prior art, as seen in FIG. 2, will have a first characteristic dimension of width W, that relates to depth d seen in FIG. 1, the characteristic width of an implant corridor 22, and the characteristic energy by which it was implanted. A gettering structure fabricated by the method of the present invention will have a second characteristic dimension that can be related to implantation depth d, implantation width w and characteristic mask gap width of implant corridor 22 as seen in FIGS. 3a and 3b. The second characteristic dimension of width w will be relatively narrower than the first characteristic dimension of width W because ions are implanted at a lower energy and penetrate to a shallower penetration depth. Such penetration does not cause as pronounced a spreading as in the prior art where implanted ions must penetrate through materials that makes a penetration distance substantially equivalent to depth d as shown in FIGS. 1 and 2. By contrast, the presence of trench 24 within semiconductor substrate 12 enables a lower energy implantation at depth d seen in FIGS. 3a and 3b as compared to the higher energy implantation at deeper depth d seen in FIGS. 1 and 2. MeV implantation equipment, however, can also be used.

The novel method enables gettering damage to be contained close to the surface of implantation with a low energy of implantation due to the presence of a trench through which the implantation is made. Although the gettering structure is close to the bottom of the trench, which is also the surface of implantation, the junction is not effected. The junction is not effected by the presence of the gettering structure because the gettering structure is not beneath and aligned with the junction, but rather is beneath and aligned with the trench, which is an isolation region.

A preferred embodiment of the present invention includes forming the recess by using a reactive anisotropic etching medium, followed by implanting ions. The ions are implanted by changing the ions of the ion implantation process for ions used in a reactive anisotropic etching medium. Changing the ions of the ion implantation process is done preferably within a single processing vessel and without exposure to the ambient. This method has the advantage of handling of the semiconductor structure a reduced number of times while subjecting it to multiple processing steps. The inventive method creates a plurality of gettering regions, seen in elevational cross section in FIG. 4A, under a trench bottom 28 without causing substantial damage within active area 20.

An advantage of the method of the present invention is that semiconductor gettering structures are formed without the cost of an extra masking procedure and without the expense of using MeV implantation equipment and procedures. Another advantage of the method of the present invention is that metallic contaminants will move more freely through region 30 toward gettering structures 32. Metallic contaminants, however, will not move as freely through substrate 12 in the regions of active areas 20. Another advantage of the present invention is that lateral spreading of ions during implantation is reduced due to the lower energy implantation of high current KeV implantation as opposed to MeV implantation.

FIG. 3a shows implantation of ions through trench 24 at an angle substantially normal to an upper surface 26, whereas FIG. 3b shows implantation of ions through trench 24 at an angle that is not substantially normal to upper surface 26. As a result gettering structure 32 is not as wide at the top thereof in of FIG. 3b as at the bottom, thereof. By using a broad range of angles of ion implantation, a substantially arcuate or crescent shape gettering structure 32, seen in FIG. 3b, can result.

Following implantation and formation of gettering structures 32, thermal processing may be carried out in order to cause some lateral spread or widening of width w of gettering structures 32 in FIGS. 3a and 3b. In some embodiments, it may be desirable that each gettering structure 32 substantially contact an adjacent gettering structure 32. The contact of one gettering structure to an adjacent gettering structure may be accomplished by directional ion implantation, seen in FIG. 3b, through implant corridor 22 and trench 24 such that ions penetrate both trench bottom 28 and trench wall 36 in a region near a bottom 38 of active area 20.

Figure 4A:
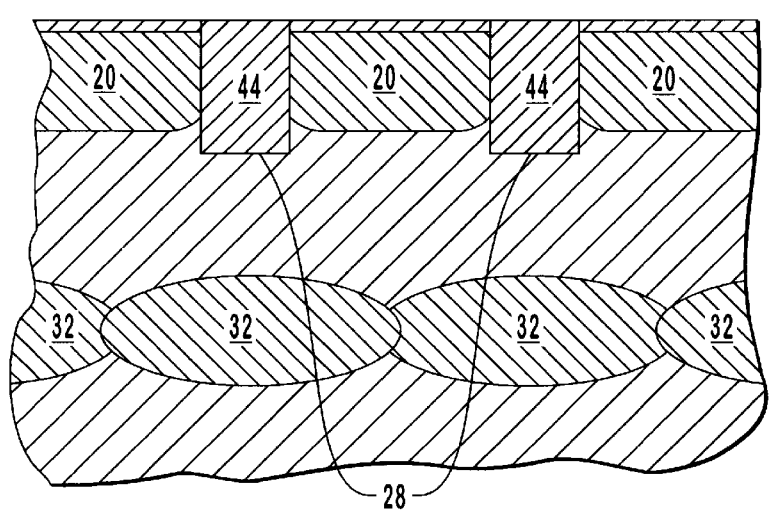
FIG. 4A is an elevation cross section view of expanded gettering structures according to the invention, in which each expanded gettering structure overlaps at least one neighboring gettering structure, and in which ion implantation concentration profiles are depicted in both horizontal (left-to-right) analysis in FIG. 4C and in a vertical (top-to-bottom) analysis in FIG. 4B.
Figure 4B:
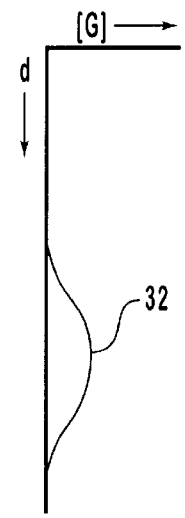
Figure 4C:
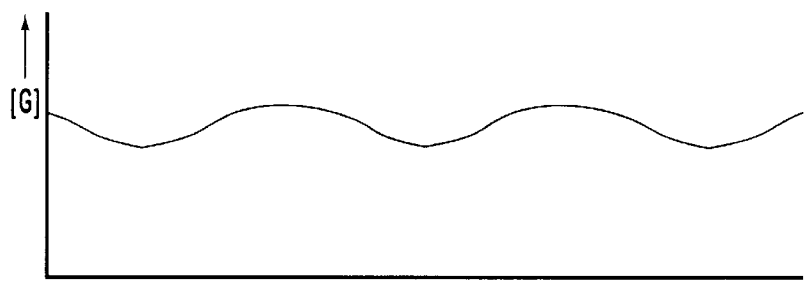

FIG. 4A illustrates the advantage of forming gettering structures 32 by the method of the present invention. The method of forming a semiconductor structure illustrated in FIG. 4A includes expanding of gettering structures 32 by thermal processing. Gettering structures 32 are substantially laterally continuous (viewed left-to-right or right-to-left) between first and second active areas 20. Formation of gettering structure 32 is carried out by implantation through trench bottom 28 while a trench 44 is open and not yet filled. As in previous embodiments, formation of gettering structures 32 is accomplished without an extra masking step by using nitride layer 16 and mask 18 that were used to form trench 24 by anisotropic etching as illustrated in FIG. 3. FIGS. 4A and 4B also illustrate gettering materials in concentration profiles by the graph in FIG. 4B to the right of semiconductor structure 10 illustrating a vertical concentration profile and below semiconductor structure 10 in FIG. 4C illustrating a horizontal concentration profile.

Figures 5A, 5B:
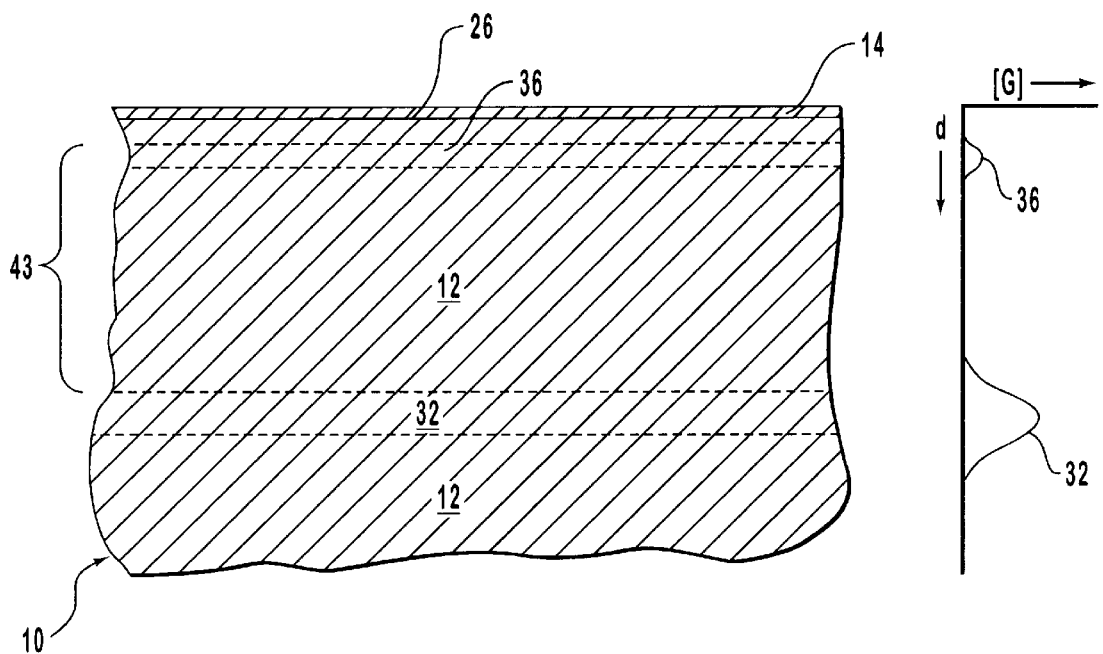
FIG. 5A is an elevational cross section view of a dual-implanted semiconductor gettering structure, where the implantation concentration profile thereof is depicted in a vertical (top-to-bottom) analysis in FIG. 5B, in which a shallow implantation assists in removing substantially all crystal originated pits (COPs) in a region above the main gettering structure, which COPs are formed incident to crystal pulling.

In another embodiment of the present invention, a dual implantation is carried out as illustrated in FIGS. 5A and 5B. In FIG. 5A, it can be seen that a semiconductor structure 10 has been dual implanted whereby a gettering structure 32 and a shallow implantation 36 are formed. The graph in FIG. 5B illustrates gettering materials concentration [G] as a function of depth within semiconductor structure 10. Shallow implantation 36 has a concentration illustrated by a concentration profile, the peak of which is also marked with the numeral 36 in the graph. Gettering structure 32 is illustrated with a concentration profile, the peak of which is also illustrated with the numeral 32 in the graph. Following dual implantation, a single anneal is carried out whereby vacancy clusters that are formed during routine crystal pulling are eliminated at the region near upper surface 26 while leaving gettering structure 32 substantially intact to act as a getterer for further processing and during field use.

Crystal originated particles or pits (COPs) are modified by reducing the defect width interstitial injection to form shallow implantation 36. Where substrate 12 is monocrystalline silicon, implantation of a neutral species such as silicon and the like will add interstitials to substrate 12. During thermal processing, the interstitials will move into the COPs thereby rectifying defects caused during crystal pulling.

In this embodiment of the present invention, an example of dual implantation is given. In a first implantation, silicon is implanted at an energy in a range from about 600 KeV to about 3 MeV, preferably from about 2 MeV to about 3 MeV, most preferably about 2.5 MeV and a concentration in a range from about 1 E14 atoms/cm$^3$ to about 1 E15 atoms/cm$^3$, preferably from about 2.5 E14 atoms/cm$^3$ to about 7.5 E14 atoms/cm$^3$, most preferably about 5 E14 atoms/cm$^3$. Thereby, gettering structure 32 is formed as illustrated in FIG. 5. A second implantation is carried out using silicon wherein implantation is done at an energy range from about 600 KeV to about 3000 KeV, preferably from about 2000 KeV to about 3000 KeV, most preferably about 200 KeV and at a concentration in a range from about 5 E12 atoms/cm$^3$ to about 5 E13 atoms/cm$^3$, preferably from about 7.5 E12 atoms/cm$^3$ to about 2.5 E13 atoms/cm$^3$, most preferably about 1 E13 atoms/cm$^3$.

Thermal processing then follows after which a substantially defect free zone 43 is formed within substrate 12. By a substantially defect free zone 43, it is intended to mean a zone in which COPs formed in spite of the current state of the crystal pulling art are reduced. The reduction of defects by this technique results in a zone 43 having defects reduced by about 50%, preferably above about 90%, and most preferably above about 99%. It can be appreciated that selection of materials and dual implant conditions will depend upon the quality of materials used, the degree of substantial elimination of COPs required, the species being implanted, and the duration and intensity of thermal processing to cause migration of implanted materials to eliminate the COPs.

Figure 6:
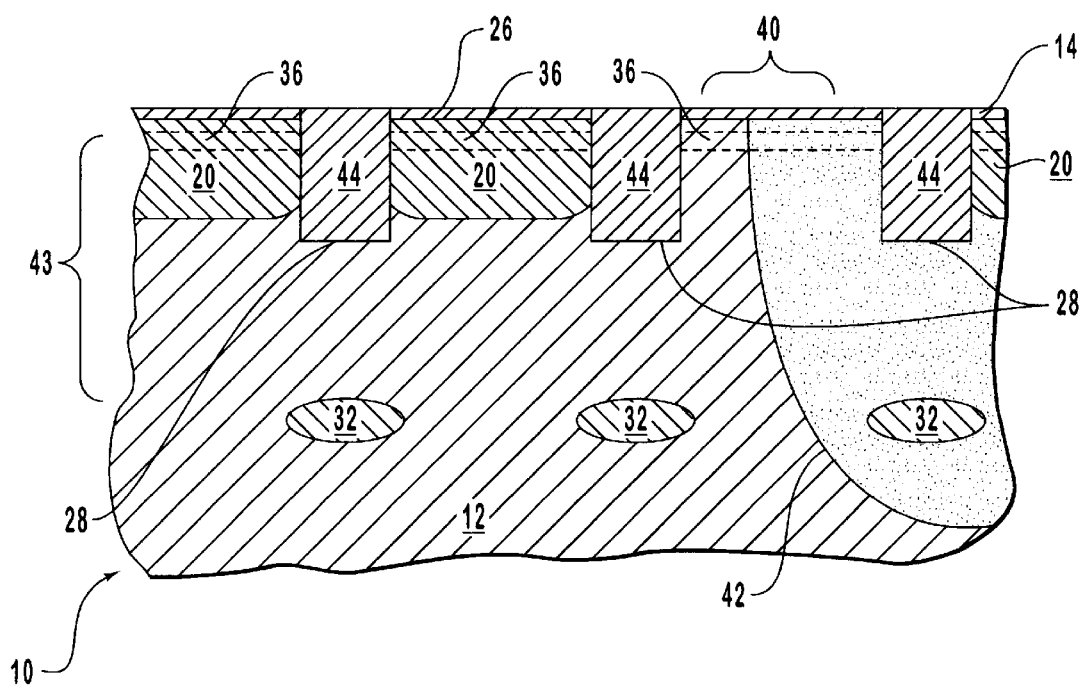
FIG. 6 is an elevational cross section view of the dual-implantation technique shown in FIG. 5 in which both the gettering structures formed and the shallow implantations are carried out after formation of isolation structures.

An alternate method embodiment illustrated in FIG. 6 combines implantation through a filled trench 44, prior to filling of the same, to form gettering structure 32 with forming shallow implantation 36. For example, filled trench 44 is first filled, preferably with a dielectric material, after implantation. Then, semiconductor structure 10 is planarized to remove nitride layer 16 as is shown in FIG. 3a and 3b. Next, shallow implantation 36 is formed and a thermal treatment is carried out to form defect free zone 43 between upper surface 26 and gettering structure 32.

Thermal processing to expand gettering structure 32 is preferably controlled such that gettering structure 32 does not expand into diode junction region 40 and across diode junction boundary 42. It will be appreciated that thermal processing conditions will be selected according to the specific application, wherein concentrations of gettering structure 32, the width of trench 44, and the size of diode junction region 40 between adjacent trenches 44 must be taken into account.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by U.S. Letters Patent is:

1. A method of forming a semiconductor structure comprising:

forming a mask having an opening therein, said mask being situated upon a semiconductor substrate, said semiconductor substrate defining a plane and being composed of semiconductor material;

forming a recess within said semiconductor substrate through said opening in said mask, said recess having a bottom;

implanting ions through the recess into the semiconductor substrate at a plurality of angles with respect to the plane of the semiconductor substrate to form a gettering structure that is beneath, centered with, and separated from said bottom of said recess, said gettering structure having a width that is less than or equal to the width of said recess.

2. A method of forming a semiconductor structure according to claim 1, wherein forming said gettering structure includes:

implanting at least one gettering material through said recess into said semiconductor structure; and said heating said semiconductor substrate to expand the size of the gettering structure within the semiconductor substrate.

3. A method of forming a semiconductor structure according to claim 1, wherein the ions are implanted at an implantation energy in a range from about 600 KeV to about 3000 KeV.

4. A method of forming a semiconductor structure according to claim 1, wherein said mask includes at least one of a nitride layer and a photoresist layer.

5. A method of forming a semiconductor structure according to claim 1, further comprising; forming a first active area in said semiconductor structure; and filling said recess with a dielectric material that is in contact with said first active area.

6. A method of forming a semiconductor structure according to claim 5, further comprising forming a second active area in said semiconductor structure; and wherein said recess contacts both said first active area and said second active area.

7. A method of forming a semiconductor structure according to claim 6, wherein the semiconductor substrate has an upper surface, the method further comprising implanting ions into the semiconductor substrate to form a pair of implantation regions respectively within the first and second active areas, each said implantation region having a top periphery beneath the upper surface of the semiconductor substrate and a bottom periphery that is within the respective one of the first and active areas.

8. A method of forming a semiconductor structure according to claim 7, wherein;

said recess has a depth in a range from about 0.2 microns to about 0.3 microns, and a width in a range from about 0.18 microns to about 0.25 microns.

9. A method of forming a semiconductor structure according to claim 5, wherein the semiconductor substrate has an upper surface, the method further comprising implanting ions into the semiconductor substrate to form an implantation region that has a top periphery beneath the upper surface of the semiconductor substrate and a bottom periphery that is within the first active area.

10. A method of forming a semiconductor structure according to claim 9, wherein:

the ions implanted into the implant region are interstitial materials and the implant region contacts the recess filled with the dielectric material.

11. A method of forming a semiconductor structure according to claim 10, wherein the concentration of ions implanted in the ion implantation region is less than that of the gettering structure.

12. A method of forming a semiconductor structure according to claim 1, wherein;

the gettering structure has a periphery defined by a top portion and a bottom portion:

the top portion of the periphery is closer to the bottom the recess than the bottom portion of the periphery;

both the top and bottom portions of the periphery have a width; and the width of the top portion is less than the width of the bottom portion.

13. A method of forming a semiconductor structure according to claim 1, wherein said recess is formed by anisotropic etching.

14. A method of forming a semiconductor structure according to claim 1, wherein said recess has:

a depth in a range from about 0.1 microns to about 1.0 microns and a width in a range from about 0.2 microns to about 0.6 microns.

15. A method of forming a semiconductor structure according to claim 1, wherein the recess is symmetrical about an axis, and wherein said gettering structure has a concentration profile, said concentration profile having a maximum concentration that is aligned with the axis of said recess.

16. A method of forming a gettering structure within a microelectronic device comprising:

forming a recess in a semiconductor substrate through a mask, wherein:

said recess has a bottom;

said semiconductor substrate defines a plane, is composed of semiconductor material, and has an upper surface;

implanting a gettering material at a plurality of angles with respect to the plane of the semiconductor substrate through said recess and into said semiconductor substrate to a depth below said bottom of said recess to form a gettering structure that is beneath, centered with, and separated from said bottom of said recess, said gettering structure having a top with a width and a bottom with a width greater than the width of the top;

removing said mask; and filling said recess with a dielectric.

17. A method of forming a semiconductor structure comprising:

forming a mask having an opening therein, said mask including at least one of a nitride layer and a photoresist layer and being situated upon a semiconductor substrate that defines a plane, is composed of semiconductor material, and has an upper surface;

anisotropic etching a recess within said semiconductor substrate through said opening in said mask, said recess being symmetrical about an axis, and having a bottom, a depth in a range from about 1.0 microns to about 0.1 microns, and a width in a range from about 0.5 microns to about 0.1 microns; and forming a gettering structure that is beneath, centered with, and separated from said bottom of said recess, said gettering structure having a width that is less than or equal to the width of said recess, wherein said gettering structure has a concentration profile, said concentration profile having a maximum concentration that is aligned with the axis of said recess, said gettering structure being formed by:

implanting at least one gettering material at a plurality of angles with respect to the plane of the semiconductor substrate through said recess into said semiconductor structure at an implantation energy in a range from about 600 KeV to about 3000 KeV; and heating said semiconductor substrate to expand the size of the gettering structure within the semiconductor substrate;

filling said recess with a dielectric material, wherein said recess electrically isolates a portion of a first active area.

18. A method of forming a semiconductor structure according to claim 17, wherein said recess is formed by using a reactive anisotropic etching medium, and wherein forming said gettering structure includes implantation of a gettering material below said bottom of the recess.

19. A method of forming a semiconductor structure according to claim 17, further comprising removing said mask and implanting interstitial materials into said semiconductor substrate above said bottom.

20. A method of forming a semiconductor structure comprising:

forming a mask having an opening therein, said mask being situated upon a semiconductor substrate;

forming a recess within said semiconductor substrate through said opening in said mask, said recess having a bottom;

forming a gettering structure that is beneath, centered with, and separated from said bottom of said recess, said gettering structure having an arcuate profile, said arcuate profile further having a top portion and a bottom portion, said top portion having a width less than that of the bottom portion and less than the width of the recess, said bottom portion having a width less than or equal to that of said recess.

21. The method as defined in claim 20, wherein forming said gettering structure includes:

implanting at least one gettering material at a plurality of angles with respect to a plane defined by the semiconductor substrate through said recess into said semiconductor structure; and said heating said semiconductor substrate to expand the size of the gettering structure within the semiconductor substrate.

22. The method as defined in claim 20, wherein forming said gettering structure includes implanting at least one gettering material through said recess into said semiconductor structure at an implantation energy in a range from about 600 KeV to about 3000 KeV.

23. The method as defined in claim 20, wherein said mask includes at least one of a nitride layer and a photoresist layer.

24. The method as defined in claim 20, further comprising;

forming a first active area in said semiconductor structure; and filling said recess with a dielectric material that electrically isolates and is in contact with said first active area.

25. The method as defined in claim 24, further comprising forming a second active area in said semiconductor structure, wherein said gettering structure is continuous between the first and second active areas.

26. The method as defined in claim 20, wherein:

said recess is formed by using a reactive anisotropic etching medium; and forming said gettering structure includes implantation of a gettering material below said bottom of the recess.

27. The method as defined in claim 26, wherein changing the gettering material for the reactive anisotropic etching medium is performed within a single processing vessel.

28. The method as defined in claim 20, wherein said recess is formed by anisotropic etching.

29. The method as defined in claim 20, further comprising:

removing said mask; and implanting interstitial materials into said semiconductor substrate above said bottom.

30. The method as defined in claim 20, wherein said recess has a depth in a range from about 0.1 microns to about 1.0 microns.

31. The method as defined in claim 30, wherein said recess has a width in a range from about 0.2 microns to about 0.6 microns.

32. The method as defined in claim 20, wherein said recess has a depth in a range from about 0.2 microns to about 0.3 microns.

33. The method as defined in claim 32, wherein said recess has a width in a range from about 0.18 microns to about 0.25 microns.

34. The method as defined in claim 20, wherein the recess is symmetrical about an axis, and wherein said gettering structure has a concentration profile, said concentration profile having a maximum concentration that is aligned with the axis of said recess.

35. A method of forming a semiconductor structure comprising:. providing a semiconductor substrate that defines a plane is composed of semiconductor material, and has an upper surface;

forming a recess within said semiconductor substrate, said recess having a bottom and a side wall that is oriented continuously perpendicular to said upper surface of said semiconductor substrate;

forming a gettering structure that is beneath, centered with, and separated from said bottom of said recess, wherein said gettering structure:

has a width that is less than or equal to the width of said recess;

has an arcuate profile, said arcuate profile having a top portion and a bottom portion, said top portion having a width that is less than the width of the bottom portion and that is also less than the width of the recess, said bottom portion having a width less than or equal to the width of said recess.

* * * * *